United States Patent
Kakkad

(10) Patent No.: US 7,507,648 B2
(45) Date of Patent: Mar. 24, 2009

(54) METHODS OF FABRICATING CRYSTALLINE SILICON FILM AND THIN FILM TRANSISTORS

(76) Inventor: Ramesh Kakkad, Chien Ho Chi Apt., Apt. #716, Dong Da Road, section 2, #145, Hsinchu (TW)

( * ) Notice: Subject to any disclaimer, the term of this patent is extended or adjusted under 35 U.S.C. 154(b) by 151 days.

(21) Appl. No.: 11/425,268

(22) Filed: Jun. 20, 2006

(65) Prior Publication Data

US 2007/0004185 A1 Jan. 4, 2007

Related U.S. Application Data

(60) Provisional application No. 60/695,287, filed on Jun. 30, 2005.

(51) Int. Cl.
*H01L 21/00* (2006.01)
(52) U.S. Cl. ............... 438/558; 438/486; 438/799; 257/E21.134; 257/E21.328
(58) Field of Classification Search ........ 438/558, 438/798, 799, 486; 257/E21.134, E21.328, 257/E21.333, E21.497
See application file for complete search history.

(56) References Cited

U.S. PATENT DOCUMENTS

| | | | |
|---|---|---|---|
| 5,147,826 A | | 9/1992 | Liu et al. |
| 5,242,507 A | * | 9/1993 | Iverson ............... 148/33 |
| 5,733,804 A | * | 3/1998 | Hack et al. ........... 438/158 |
| 6,162,711 A | * | 12/2000 | Ma et al. ............. 438/558 |
| 6,355,544 B1 | * | 3/2002 | Essaian et al. ........ 438/535 |
| 7,078,325 B2 | * | 7/2006 | Curello et al. ........ 438/542 |
| 2003/0124799 A1 | * | 7/2003 | Ping et al. ........... 438/255 |
| 2005/0239263 A1 | * | 10/2005 | Ping et al. ........... 438/398 |

* cited by examiner

*Primary Examiner*—Caridad M Everhart

(57) ABSTRACT

A method by which solid phase crystallization (SPC) thermal budget for crystallizing an undoped (or a lightly doped) amorphous Si (a-Si) is significantly reduced. First, a composite layer structure consisting of an undoped (or a lightly doped) a-Si layer and a heavily doped (either p-type or n-type) a-Si layer is formed and it is subsequently annealed at an elevated temperature. The solid phase crystallization starts from the heavily doped amorphous silicon layer at a substantially reduced thermal budget and proceeds to crystallize the undoped amorphous silicon layer in contact with the heavily doped film at reduced thermal budget. The method can be applied to form poly silicon thin film transistor at reduced thermal budgets.

66 Claims, 4 Drawing Sheets

METHODS OF FABRICATING CRYSTALLINE SILICON FILM AND THIN FILM TRANSISTORS

REFERENCE TO RELATED APPLICATIONS

This application claims an invention which was disclosed in Provisional Application No. 60/695,287, filed Jun. 30, 2005, entitled "Methods of Fabricating Crystalline Silicon Film and Thin Film Transistors". The benefit under 35 USC §119(e) of the United States provisional application is hereby claimed, and the aforementioned application is hereby incorporated herein by reference.

BACKGROUND OF THE INVENTION

1. Field of the Invention

The invention pertains to the field of semiconductor fabrication. More particularly, the invention pertains to methods of crystallizing amorphous silicon film and methods of forming thin film transistor structures incorporating the silicon film formed using solid phase crystallization.

2. Description of Related Art

Polycrystalline silicon (polysilicon) thin film transistor (TFT) arrays are used as backplanes for switching liquid crystal displays (LCDs) and also for driving organic light emitting diode (OLED) displays. For the LCD applications, polysilicon TFTs need to be used instead of more popular amorphous silicon (referred to as a-Si or a-Si:H)) TFTs, when peripheral driving circuit is also made using TFTs, since polysilicon TFTs have about two orders of magnitude higher carrier mobility compared to that for a-Si TFTs. Additionally for higher resolutions LCDs, polysilicon TFTs are preferred over a-Si TFTs. For OLED applications, currently the use of polysilicon TFTs is the only practical way to make reliable displays as instability of a-Si TFTs make long-term OLED operations difficult.

In polysilicon TFTs, the active layer (channel layer of TFTs) is made of polycrystalline silicon. During the fabrication of polysilicon TFTs, the channel layer is usually deposited as a-Si and it is subsequently annealed to convert it to the polycrystalline silicon. This process is referred to as crystallization. The crystallization of a-Si needs to be performed at a thermal budget (temperature/time budget) lower than that which could damage glass substrate used for displays. The most commonly used method for crystallization in the display industry today is excimer laser annealing (ELA), as thermal budgets encountered during the ELA process do not cause damage the glass substrate. Although the ELA process is the most commonly used method, it has several disadvantages. First of all, the ELA process is expensive in terms of cost of equipment, its operation and maintenance. Secondly, since the ELA is performed by scanning a pulsed laser beam, there is a non-uniformity in TFT characteristics resulting from pulse-to-pulse variation of energy of the laser beam. The scanning non-uniformity is visible on an image of a OLED display in the form of scan lines. Additionally there is a high surface roughness for polycrystalline silicon layer formed using ELA. For example, for a 500 A thick a-Si precursor, the root mean square (RMS) roughness value for the resulting polysilicon film after ELA is of the order of 100 angstrom with peak to valley distances of several hundred angstroms. The high value of surface roughness for polysilicon formed by ELA process affects the TFT performance adversely.

The least expensive and the simplest crystallization process for a-Si is thermal annealing and it is known as solid phase crystallization (SPC). However, the thermal budgets needed to crystallize a-Si by SPC are too high to be practical for mass production of TFTs. For example, for a-Si films deposited at about 250° C. by a PECVD method, the annealing time needed to crystallize the films at 600° C. is about 15 hours. Such times are too long for mass production of devices.

The annealing times for crystallization can be reduced exponentially by increasing the temperature. For example, for the same a-Si film mentioned above, the crystallization time at 650° C. is about 80 minutes and at 700° C., it is of the order of 10 minutes. However, the glass substrate used for these TFTs can easily bend at these thermal budgets.

The above thermal budgets are typical but can vary somewhat depending on deposition conditions and type of deposition method (example: PECVD, LPCVD, sputtering) used for a-Si films. For example, for the PECVD case, the crystallization thermal budgets are lower, when a-Si film is deposited at higher temperatures. However, such higher-temperature-deposited a-Si films tend to have pre-existing crystal embryos, which result in higher nucleation density upon annealing, leading to reduced polysilicon grain-size. The reduced Si grain-size lowers the device performance.

In order to reduce thermal budget for crystallization of a-Si, people have deposited certain metals such as Ni, Pd etc. on the a-Si surface and crystallized it by a process called metal induced crystallization (MIC) at thermal budget 100 to 150° C. lower than those needed during SPC (Liu, Kakkad, Fonash, U.S. Pat. No. 5,147,826). This method is very attractive because of its lower thermal budget, but during the annealing, there is an incorporation of the metals or their silicides into the entire silicon layer, which affect the device characteristics adversely, especially the leakage current, which increases significantly for these devices.

It was found that a-Si films heavily doped with p-type or n-type dopants crystallized at significantly reduced thermal budgets. For example, by heavily boron doping a-Si films by incorporating boron during deposition (gas phase doping), the crystallization times at 600° C. can be reduced by an order of magnitude compared to that for undoped film deposited under similar conditions, The reduction in crystallization thermal budgets can also seen for other silicon dopants such as phosphorus. Generally no reduction in crystallization thermal budget can be seen for doping concentration below $10^{19}$ $cm^{-3}$ but a significant reduction in the crystallization thermal budget can be obtained for dopant concentrations $10^{20}$ $cm^{-3}$ and higher.

It is also found that the grain size of the heavily doped silicon film after the crystallization is equal to or larger than that for undoped silicon films crystallized at the same temperature. Thus even though the crystallization times for doped films are smaller, the grain size is not reduced.

Although the heavily doped silicon films can be crystallized in shorter times, they can not be used as channels in TFTs. An undoped or lightly doped film is needed for the channel layer of TFTs.

SUMMARY OF THE INVENTION

The invention presents a method by which solid phase crystallization (SPC) thermal budget for crystallizing an undoped (or a lightly doped) amorphous Si (a-Si) is significantly reduced. First, a composite layer structure consisting of an undoped (or a lightly doped) a-Si layer and a heavily doped (either p-type or n-type) a-Si layer is formed and it is subsequently annealed at an elevated temperature. The solid phase crystallization starts from the heavily doped amorphous silicon layer at a substantially reduced thermal budget and proceeds to crystallize the undoped amorphous silicon film in contact with the heavily doped film at reduced thermal budget. The method can be applied to form poly silicon thin film transistor at reduced thermal budgets.

DETAILED DESCRIPTION OF THE INVENTION

Figure 1:
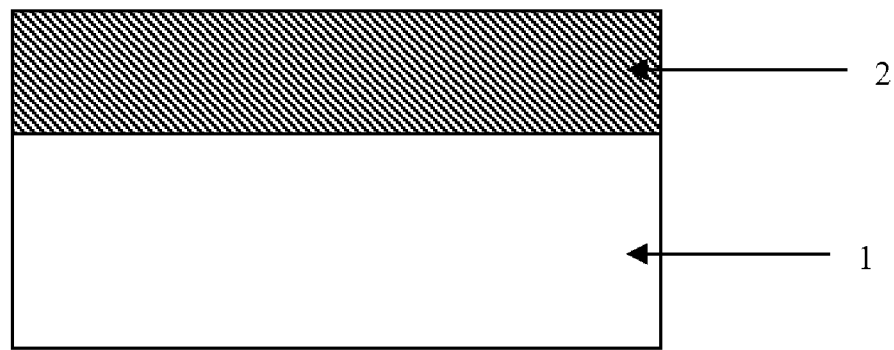
FIG. 1 is a schematic of a structure to crystallize amorphous silicon at reduced thermal budget according to the disclosed method.
Figure 6:
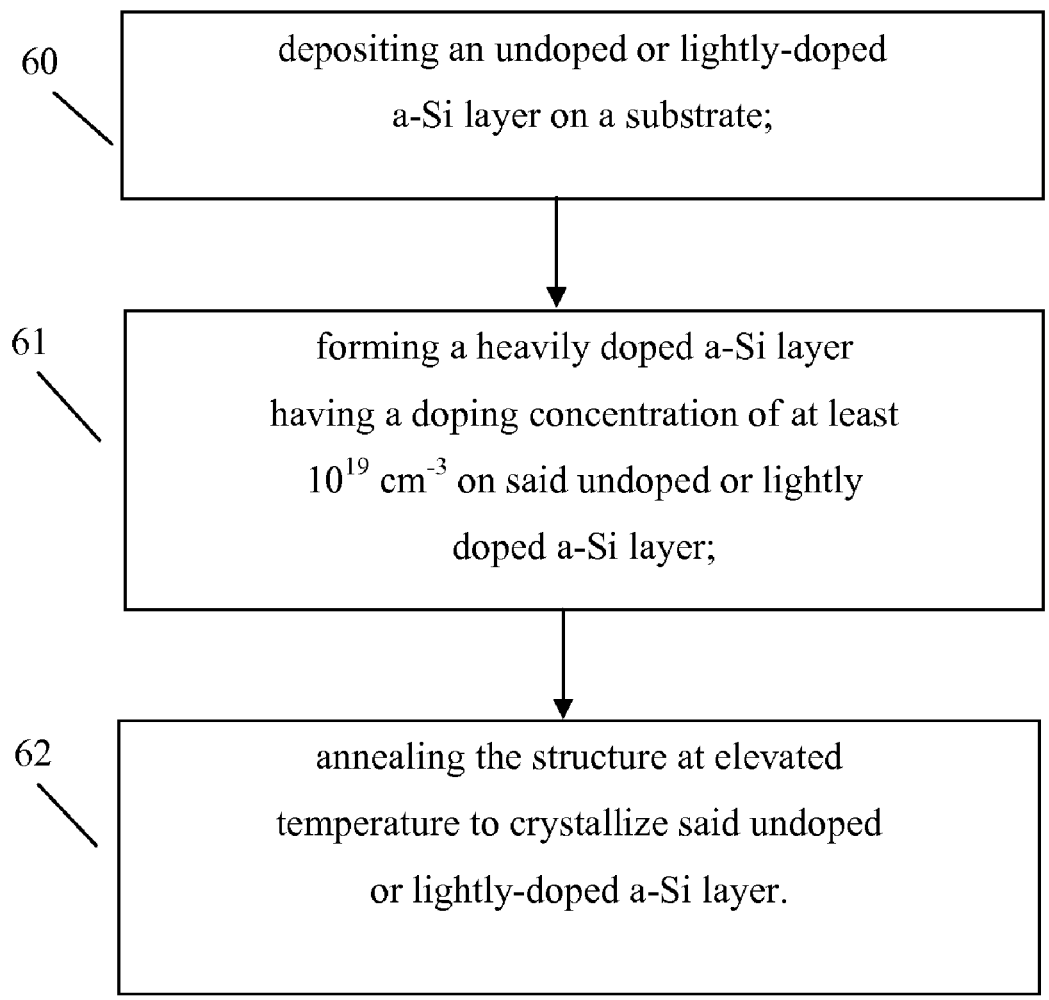
FIG. 6 is a flowchart of the invention

FIG. 6 shows a flowchart of the invention, as it might be used to create the structure shown schematically in FIG. 1. According to the method of the invention, step 60, an undoped a-Si film 1 (for example to be used as an active layer of TFT) of the desired thickness is deposited on a desired substrate. If needed, the undoped film can be lightly doped, for example, for threshold voltage adjustment of TFT, but the doping levels for this film would be very low (generally of the order of $10^{17}$ cm$^{-3}$), so this film will be referred as undoped film. On this undoped a-Si film, step 61, a heavily gas-phase doped a-Si film 2 (for example boron doped film with doping concentrations in the range of $10^{20}$-$10^{21}$ cm$^{-3}$) is deposited without breaking the vacuum. The structure is then, step 62, annealed at an elevated temperature. The doped film 2 crystallizes at lower thermal budget as was mentioned earlier and crystallization process continues to the undoped layer.

The reduction in the crystallization time for the disclosed method can be explained as follows. In the case, the doped a-Si layer 2 is not used, in order to fully crystallize the undoped a-Si film 1, first the nuclei have to form in the undoped layer (which, for example at 600° C. takes several hours) and these nuclei have to grow laterally about half the distance between them, which is of the order of a micrometer (equal to the final grain size after crystallization) at 600° C. In the case of the disclosed method, once the doped layer 2 is crystallized, crystal growth in the undoped a-Si layer 1 takes place vertically (along the film thickness) starting from the crystallized, heavily-doped silicon film 2.

Typically in TFTs, an active layer is several hundred angstroms thick, requiring grains to grow vertically several hundred angstroms in order to completely crystallize it by the proposed method. This distance is only a fraction of the lateral growth distances encountered when the undoped film 1 is crystallized without the presence of the heavily doped layer 2. Thus the crystallization thermal budgets are significantly reduced by using the disclosed method. Also the grain size of the resulting undoped polysilicon layer is not reduced in spite of the lower crystallization times as the grain size in the undoped layer is determined by the grain size in the doped layer, which at a given crystallization temperature, depending upon the type of dopant, is equal to or larger than that for undoped film crystallized without the presence of the doped silicon. After the crystallization of the undoped film 1, the doped film 2 is etched away (selectively or completely) leaving only the crystallized undoped silicon film.

The following example illustrates the extent of reduction in crystallization thermal budgets of a-Si using the disclosed method. For an undoped a-Si film deposited at 250° C. using plasma enhanced chemical vapor deposition (PECVD) method using silane (SiH$_4$) as precursor gas, the crystallization times are about 15 hours at 600° C. For the structure of the FIG. 1, where the undoped film 1 is 500 angstroms thick (deposited using the same conditions as above) and where a boron-doped film is deposited by adding diborane (B$_2$H$_6$) gas to silane gas during the PECVD deposition (gas phase doping), the crystallization time for the entire structure at 600° C. is about 2 hours. This thermal budget is significantly lower than 15 hours needed at 600° C. to crystallize the undoped film alone. For this structure, the crystallization times at 650° C. are of the order of 10-15 minutes, down from about 80 minutes needed to crystallize the undoped film without the use of the doped film.

It was mentioned above that the boron doped a-Si film was gas-phase-doped. Instead of depositing two separate layers, a single undoped a-Si layer can be deposited and the top part of this layer can be heavily doped by ion implantation or by ion doping technique to obtain the proposed structure of FIG. 1. Due to ion damage during implantation, the crystallization times are little longer using this approach compared to those using the gas phase doped film. For the boron doping concentration of $10^{21}$ cm$^{-3}$ (doped by ion implantation) for the top doped a-Si layer 2, and for a 500-600 angstroms thick above mentioned undoped a-Si layer 1, the crystallization times for the entire structure are about 3-3.5 hours at 600° C. and about 20 minutes at 650° C. Compared to ion-implantation, process, the ion doping process causes less damage thus ion doping would be preferred.

It must be noted that the crystallization times for the disclosed method depend upon on the thickness of the undoped film with thicker film requiring correspondingly longer times.

For the doped a-Si layer, a heavily phosphorus-doped a-Si film can be used instead of the boron doped a-Si layer. Using the gas phase phosphorus doped a-Si film, the crystallization time using the disclosed method is about 4 hours at 600° C. for a of 500 A thick undoped layer (down from 15 hours). Other n-type or p-type dopants of silicon can also be used instead of phosphorus or boron, respectively.

The annealing temperatures lower than 600° C. or higher than 650° C. can also be used with corresponding change in the annealing time.

The crystallization thermal budget values in the above examples only serve to illustrate an extent of reduction in thermal budgets that can be obtained using the disclosed method. As it was mentioned before, the crystallization thermal budgets are affected by deposition conditions and type of deposition method used for a-Si films.

No significant dopant diffusion from the heavily doped layers, such as phosphorus or boron doped layers, to the undoped layer occurs at the crystallization thermal budget to affect the conductivity of the undoped film. This is unlike metal induced crystallization process of the prior art, where metal diffuses into entire silicon layer affecting the electrical properties of the undoped silicon and the devices fabricated using the silicon.

As was mentioned before, after the crystallization, the doped silicon film is etched away. It can be etched entirely from the top of the undoped silicon film or it can be etched away only from above the channel region of TFT leaving it in source-drain areas for making contacts to the TFTs. If the doped layer is entirely etched, either p-channel or n-channel TFTs can be formed by subsequently doping the source-drain regions either p-type or n-type, respectively. If the doped layer is kept in the source and drain areas, only one type of TFTs can be fabricated consistent with the conductivity type of the doped layer. The later is a simpler process as additional steps for doping the source-drain regions are not needed.

The crystallization thermal budgets in the disclosed method can be further reduced, if the annealing is performed in an oxidizing ambient. For oxidizing ambient, $O_2$ or $H_2O$ ambient can be used. At higher pressures, the oxidation rates are faster, thus crystallization thermal budgets can be even further reduced if high pressures are used in combination with an oxidizing ambient. It is also possible to completely oxidize the doped layer located on the top in the case of annealing in high pressure oxidizing ambient. (There are high-pressure vessels available in TFT industry with $H_2O$ pressures as high as 2 Mpa, giving oxidation rate of over 400 angstroms per hour and consuming about 200 angstroms of silicon per hour). The $SiO_2$ formed during annealing can be etched away by wet etching (HF) or dry etching, leaving only the undoped crystallized silicon film, which is suitable for active layer of TFTs.

TFT APPLICATION EXAMPLE 1

Inverted Staggered TFT Structure

The example shows TFT application of the above crystallization methods to a bottom-gate type TFT.

Figure 2:
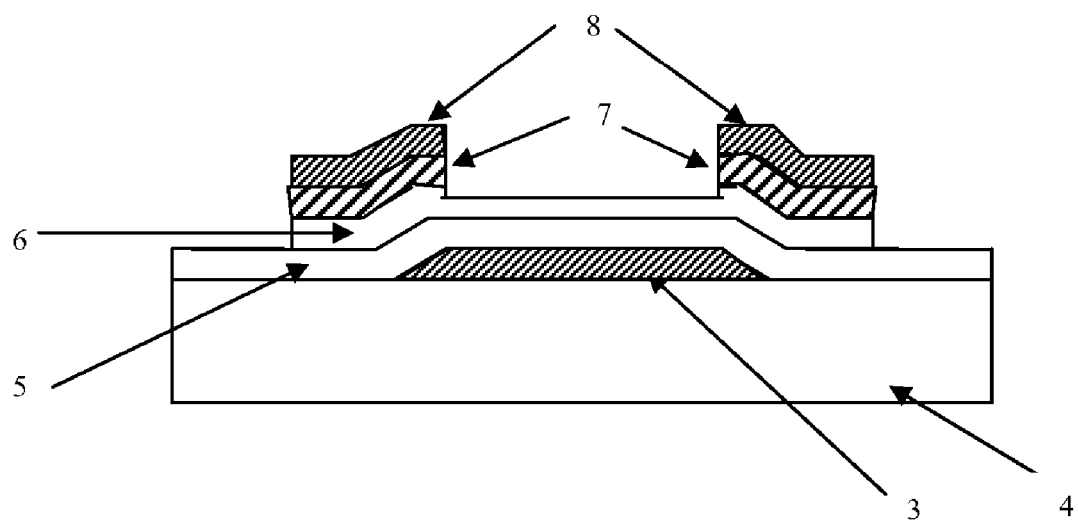
FIG. 2 is a schematic of a inverted-staggered (bottom-gate) TFT structure fabricated with the silicon channel layer crystallized at reduced thermal budget using the disclosed method.

As can be seen in FIG. 2, a gate-metal layer 3 is deposited and patterned on a substrate 4. Generally, in semiconductor processing, a layer can formed in a desired pattern (referred as patterning) by using photolithography and etching processes. On the gate metal, a gate-insulator layer 5 is deposited. The gate-insulator material could be silicon dioxide or silicon nitride or a composite containing the two or more layers. On the gate-insulator layer, an undoped amorphous silicon layer (active layer) 6 is deposited without breaking the system vacuum. On the active layer 6, a heavily doped a-Si 7 is formed. The heavily doped a-Si layer can be formed by gas-phase doping during deposition or it can be formed by ion implantation or ion doping of dopant material in the top part of the undoped a-Si layer 6.

The heavily doped a-Si layer 7 and the undoped amorphous silicon 6 layers are patterned simultaneously to form silicon islands in order to electrically isolate devices from each other. The structure is annealed to cause crystallization of the undoped amorphous silicon layer 6 in contact with the heavily doped silicon layer 7 at reduced thermal budget as was discussed earlier. Alternatively, this annealing can be done before the silicon island formation. The annealing can be performed in an inert ambient or an oxidizing ambient.

A source-drain metal layer 8 is deposited and patterned. Using the patterned source-drain metal as mask, the doped silicon layer 7 is etched away from above the channel layer 6 of TFTs as shown in the FIG. 2. During the etching of the doped layer 7 from above the channel layer 6, top part of the channel layer (undoped layer) also need to be etched to ensure that no doped layer 7 remain on the channel.

The figure shows the structure fabricated using the process described so far. Additional passivation layer such as silicon nitride and pixel electrode such as indium tin oxide (ITO) or indium zinc oxide (IZO) layers can be added to complete the TFT arrays. The silicon nitride layer can be used as source of hydrogen to passivate the polysilicon grain boundaries in order to improve the performance of TFTs. In that case, after the deposition of the silicon nitride layer, the structure is annealed at temperature generally higher than the silicon nitride deposition temperature. Hydrogen contained in the deposited silicon nitride layer is released during the annealing and passivates the polysilicon grain boundaries.

The process described above is similar to a typical process for a bottom-gate, inverted-staggered a-Si TFT process with the exception that an additional annealing is used to cause crystallization of the active layer at a reduced thermal budget as per the disclosed method. In a-Si TFT processing, the gas-phase-doped a-Si layer is used as contact layer to source-drain electrodes, while in this example, the doped layer serves two purposes; a layer which reduces crystallization thermal budget of the active layer and a contact layer to the source-drain electrodes.

Thus to a conventional a-Si TFT fabrication process, we need to add only an extra annealing step to get polycrystalline silicon TFTs at reduced thermal budget. We also note that in the case of a-Si TFTs, the contact layer should only be n-doped as only n-type a-Si TFTs have adequate mobility, while in the case of poly crystalline silicon TFTs, either p-doped or n-doped contact layer can be used as both type of polycrystalline silicon TFTs are possible. If needed, an additional implantation of a dopant material can be carried out in to the source drain regions.

For the heavily doped a-Si layer (layer 7), generally p-type layers (such as boron or aluminum doped a-Si) would be preferred as these layers require lower thermal budget for crystallization compared to n-type doped layers. Thus p-channel TFTs can be formed at lower thermal budgets. If n-channel TFTs are desired at such low crystallization thermal budgets, then heavily doped p-type a-Si can be used for crystallization and after the crystallization of active layer, the p-type Si layer is removed from above the channel regions as well as the source drain regions. Subsequently the source and drain regions are n-type doped to make n-channel TFTs.

As was mentioned before, one of the applications of the polycrystalline silicon TFTs is driving organic light emitting diode (OLED) displays as amorphous silicon TFTs do not have stability to reliably drive OLED for a long period of time. The current fabrication process for polycrystalline silicon TFTs used for making OLED displays is expensive. The above method of making crystalline Si TFTs is similar to that of inexpensive a-Si TFT process with only one additional annealing step.

Thus current production lines of a-Si TFTs can be used for producing polycrystalline silicon TFTs, and additional investment for making new lines is not needed. The current substrate size for a-Si TFT is much larger than that for polycrystalline silicon TFTs. This process makes it possible to use large substrate for crystalline silicon TFTs as those used in a-Si TFT processing, thus significantly reducing the OLED display cost. Also due to higher mobility of crystalline silicon TFTs compared to a-Si TFTs, it is possible to fabricate periphery circuit using the crystalline silicon TFTs, thereby further reducing the cost for OLED as well as current LCD displays.

TFT APPLICATION EXAMPLE 2

Top-Gate Co-Planar Structure

Figure 3A:
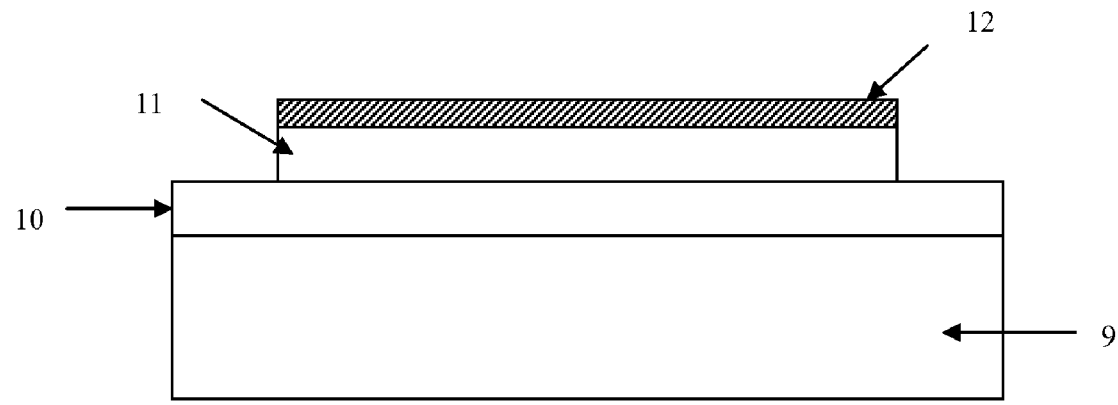
FIGS. 3A and 3B depicts fabrication process for a top-gate, co-planar TFT structure incorporating the crystallized silicon channel formed at the reduced thermal budget.
Figure 3B:
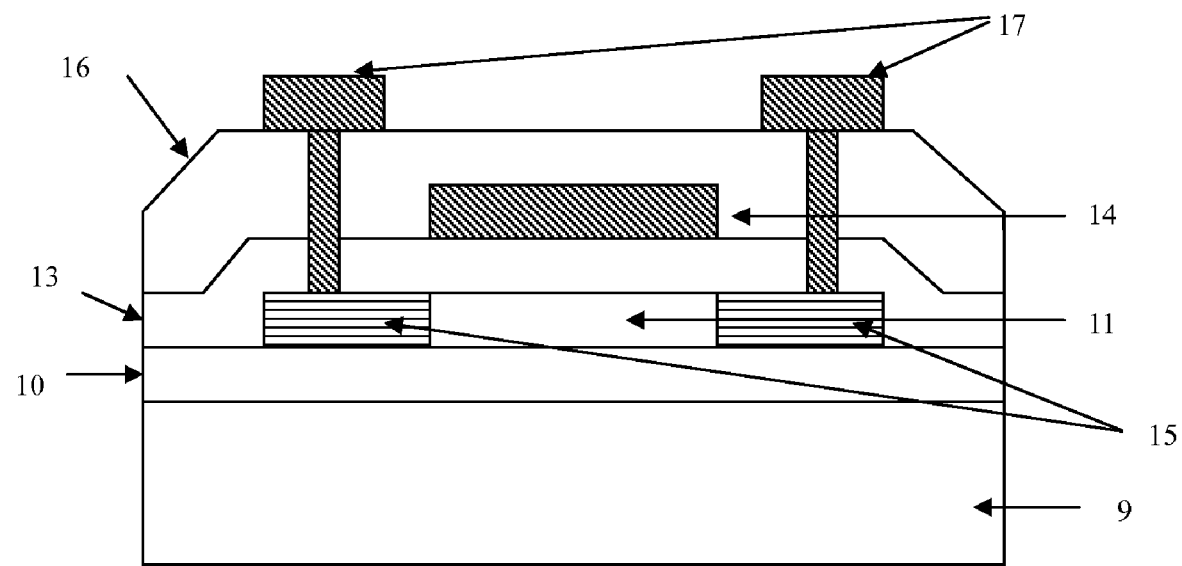

FIGS. 3A and 3B show fabrication process for a top-gate, coplanar poly crystalline silicon TFT using the disclosed a-Si crystallization method. On a substrate 9, a barrier layer 10 such as silicon nitride is deposited. On top of the barrier layer, an undoped a-Si layer 11 is deposited. A gas-phase heavily doped a-Si layer 12 is deposited on the undoped layer without breaking the vacuum. Instead of depositing the gas-phase doped a-Si layer, the top part of the undoped a-Si layer 11 can be heavily implanted or ion doped to create the doped a-Si layer 12. The structure is annealed to cause crystallization of the undoped a-Si layer 11 at a reduced thermal budget as was discussed earlier. Crystallization can be carried out in an inert ambient or an oxidizing ambient.

The doped silicon layer 12 is etched away (either entirely or leaving it on source-drain regions for contact purpose). The undoped silicon layer 11, and the doped silicon layer 12 (if present) are patterned into islands to isolate devices. The basic TFT structure is completed by depositing a gate insulator layer 13, forming a gate electrode 14 by a gate-metal layer deposition and patterning, forming source-drain regions 15 by implantation of dopants into the undoped layer 11 (for the case when the doped layer is entirely etched from above the undoped layer), depositing interlayer dielectric layer 16, forming holes through the interlayer dielectric layer 16 and gate insulator layer 13, and forming source and drain electrodes 17 by metal deposition and patterning.

The completed structure is shown in FIG. 3B for the case when the doped layer 12 is completely etched from above the undoped layer 11 and source drain regions 15 are formed by an implantation technique. The TFT-arrays can be fabricated by further deposition and patterning of a passivation layer (such as silicon nitride layer) and deposition and patterning of a pixel electrode layer.

Other applicable TFT structures of the disclosed crystallization methods are staggered TFTs and inverted co-planar TFTs Application to Short Channel Devices For use in system on panels (SOP) displays, the circuit-TFTs need to have high speed which requires the use of short channel devices. In the case of short-channel devices, when the channel size is comparable to or shorter than the poly silicon grain size, the TFT performance can be very non-uniform, because the number of grain-boundaries within a TFT channel can vary from zero to one or even two as grain-boundaries are formed randomly during a crystallization process. The disclosed crystallization approach can be applied to precisely control the number of grain boundaries within a channel. The approach is as shown below.

Figure 4A:
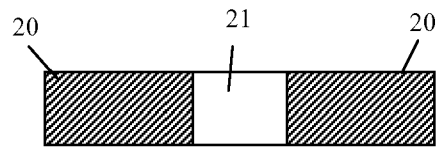
FIGS. 4A, 4B, and 4C show schematics for crystallization of a-Si by a lateral growth for application to short channel devices.
Figure 4B:
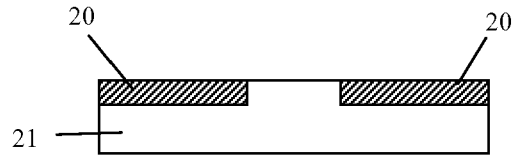
Figure 4C:
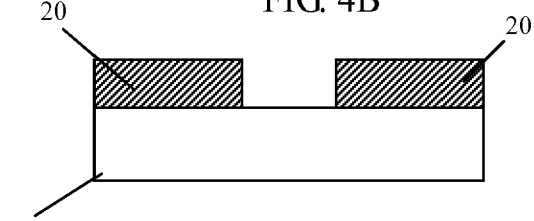

An a-Si film is deposited as shown in FIG. 4. The areas on either side of a channel are then heavily doped by ion implantation or ion doping as shown in FIG. 4A or 4B or a heavily doped gas phase amorphous silicon layer is formed on top of the a-Si as shown in FIG. 4C. In the figure, 20 represents heavily doped regions, while 21 represents undoped regions.

Upon annealing, the doped regions crystallize at reduced thermal budget, and grains begin to grow laterally from the two doped regions into the undoped channel region. During the lateral growth, there is no grain boundary perpendicular to the growth direction. The grains meet in the middle resulting only in one grain-boundary per channel in the direction perpendicular to the growth direction (direction of current flow during the device operation). If no grain-boundary perpendicular to the current-flow is desired in the channel, then the doped region must be used only on one side of the channel. The lateral crystal growth time depends upon the channel length.

For heavy boron doping ($10^{21}$ cm$^{-3}$) on either side of the channel and for 1 micron channel length, the crystallization times at 600° C. and 650° C. are of the order of 7 hours and 40 minutes, respectively, which are about half those needed to crystallize the same film without the use of the doped region. A sub-micrometer channel length will require shorter times while a channel longer than one micrometer will require correspondingly longer times.

Thus this approach controls the number of grain boundaries in a channel of a TFT as well as it reduces the crystallization thermal budget for short channel devices. The crystallization thermal budget can be further reduced if the annealing is performed in an oxidizing ambient. The doped regions can be used as source and drain regions for 4A, 4B, and 4C type of structures or can be etched away from 4B and 4C type of structures and can be subsequently doped with desired type of dopants by an implantation method.

Although the circuit TFTs require short-channels for obtaining high speed operation, the pixel TFTs generally need longer channels. In a display application, both types of TFTs (circuit TFTs and pixel TFTs) need to be formed on same substrate at the same reduced crystallization thermal budgets. So using the lateral growth approach, we can crystallize channel regions of circuit TFTs, but in the same period we can not crystallize the longer channels of pixel TFTs. The channel regions in the pixel-TFTs can be fully crystallized by the time the channel regions of circuit-TFTs are crystallized by lateral growth, if the channel areas of the pixel-TFTs are completely covered by a heavily doped silicon layer as in FIG. 1 and are crystallized by the vertical growth starting from the heavily doped films.

Figure 5A:
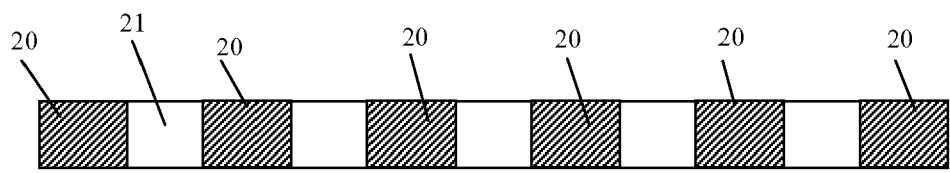
FIGS. 5A, 5B, and 5C show schematics for crystallization of a-Si by a lateral growth by dividing a long channel into multiple short channels.
Figure 5B:
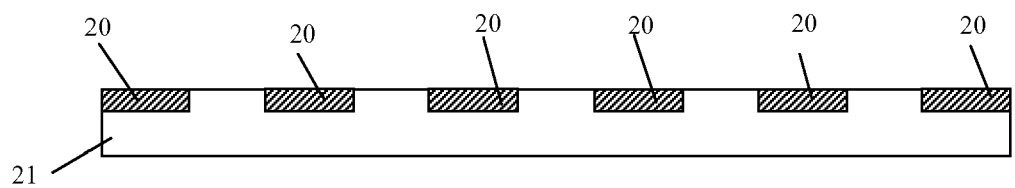
Figure 5C:
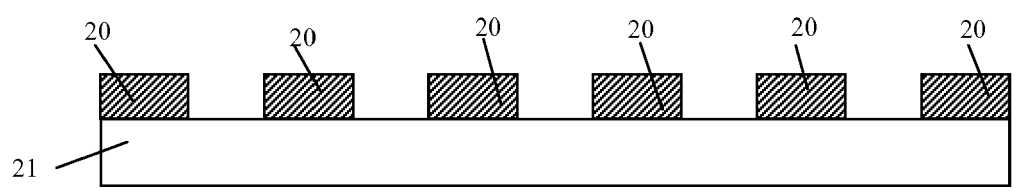

Another alternative is to divide the pixel-TFT channels in to several short channels each of which is of the same length as those in the circuit TFTs by forming several alternating doped and undoped regions as shown in FIGS. 5A, 5B, and 5C below. Upon annealing, the active regions in circuit-TFTs and pixel-TFTs are simultaneously crystallized by lateral growth. The number of grain boundaries perpendicular to current flow in the pixel-TFTs will be more (equal to the number of divisions), however since for the pixel-TFTs, the operation speed is not very important, the higher number of grain boundaries in pixel TFTs is not a problem. Also, the number of grain boundaries per pixel TFT would be same for all pixels, resulting in improved pixel-to-pixel uniformity. Such multi-channel TFTs also have better reliability, as applied voltage between source and drain is divided into several small biases.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of crystallizing an amorphous silicon (a-Si) comprising the steps of;
    a) depositing an undoped or lightly-doped a-Si layer on a substrate;
    b) forming a heavily doped a-Si layer having a doping concentration of at least $10^{19}$ cm$^{-3}$ on or in said undoped or lightly doped a-Si layer; and
    c) annealing at elevated temperature to crystallize said undoped or lightly-doped a-Si layer at a thermal budget below that which would crystallize said undoped or lightly doped silicon layer without the heavily doped a-Si thereon, such that the crystallization starts from the heavily doped a-Si layer and continues to crystallize the undoped or lightly doped a-Si layer;
    wherein the annealing step (c) is performed in the presence of an oxidizing ambient.

2. The method of claim 1, in which the heavily doped a-Si layer is formed as a plurality of discontinuous areas, and the annealing step (c) crystallizes said undoped or lightly doped a-Si layer by lateral crystal growth staffing from discontinuous areas of the heavily doped a-Si layer.

3. The method of claim 1, wherein said heavily doped a-Si layer has a doping concentration of at least $10^{20}$ cm$^{-3}$.

4. The method of claim 1, wherein said undoped or lightly-doped a-Si layer has a doping concentration of no more than $5 \times 10^{17}$ cm$^{-3}$.

5. The method of claim 1, wherein step (b) of forming the heavily doped a-Si layer is performed by deposition, and dopant species are mixed with silicon during the deposition.

6. The method of claim 1, wherein step (b) of forming the heavily doped a-Si layer is performed by implantation of at least one dopant species into said undoped or lightly-doped a-Si layer deposited in step (a).

7. The method of claim 1, wherein said heavily doped a-Si layer is doped with a dopant selected from a group comprising boron and phosphorus.

8. The method of claim 1, wherein the annealing step (c) is carried by an annealing apparatus selected from the group comprising a furnace, a lamp or a light source, and a combination of a furnace and a lamp or light source.

9. The method of claim 1, wherein the annealing step (c) is carried out at a temperature range from 500° C. to 750° C.

10. The method of claim 1, wherein the annealing step (c) is done at 600° C. for no more than 6 hours.

11. The method of claim 1, wherein the annealing step (c) is done at 650° C. for no more than 40 minutes.

12. The method of claim 1, wherein said oxidizing ambient is selected from the group comprising oxygen and $H_2O$.

13. The method of claim 1, wherein the annealing step (c) is at a pressure higher than 1 atmosphere.

14. The method of claim 1, wherein the undoped or lightly doped a-Si layer has a thickness in the range of 400 to 2000 angstroms.

15. A method of fabricating an inverted staggered bottom gate TFT structure having a source, a channel, a gate and a drain, comprising the steps of:
 a) forming a gate electrode pattern on a substrate;
 b) depositing a gate insulator layer, and an active layer of a-Si sequentially;
 c) forming a heavily doped layer of a-Si having a doping concentration $10^{19}$cm$^{-3}$ or higher on the active layer;
 d) annealing at elevated temperature to crystallize the active layer at a thermal budget lower than that is needed to crystallize the active layer without the presence of the heavily doped layer thereon;
 e) patterning the heavily doped layer and the active layer to form islands to isolate devices;
 f) depositing and patterning source and drain electrodes; and
 g) etching the heavily doped layer from above the active layer.

16. The method of claim 15, wherein said heavily doped layer has a doping concentration of at least $10^{20}$cm$^{-3}$.

17. The method of claim 15, wherein said active layer has a doping concentration no higher than $5 \times 10^{17}$ cm$^{-3}$.

18. The method of claim 15, wherein step (c) of forming the heavily doped layer is performed by deposition, and dopant species are mixed with silicon during the deposition.

19. The method of claim 15, wherein step (c) of forming the heavily doped layer is performed by implantation of at least one dopant species into said active layer deposited in step (b).

20. The method of claim 15, wherein the heavily doped layer is doped with a dopant selected from a group comprising boron and phosphorus.

21. The method of claim 15, wherein the annealing step (d) is carried by an annealing apparatus selected from the group comprising a furnace, a lamp or a light source, and a combination of a furnace and a lamp or light source.

22. The method of claim 15, wherein the annealing step (d) is carried out at a temperature range from 500° C. to 750° C.

23. The method of claim 15, wherein the annealing step (d) is done at 600° C. for no more than 6 hours.

24. The method of claim 15, wherein the annealing step (d) is done at 650° C. for no more than 40 minutes.

25. The method of claim 15, wherein the annealing step (d) is at a pressure higher than 1 atmosphere.

26. The method of claim 15, wherein said active layer has a thickness in the range of 400 to 2000 angstroms.

27. The method of claim 15, wherein the annealing step (d) is carried out in the presence of an oxidizing ambient.

28. The method of claim 27, wherein said oxidizing ambient is selected from the group comprising oxygen and $H_2O$.

29. A method of fabricating an inverted staggered bottom gate TFT structure having a source, a channel, a gate and a drain, comprising the steps of:
 a) forming a gate electrode pattern on a substrate;
 b) depositing a gate insulator layer, and an active layer of a-Si sequentially;
 c) forming a heavily doped layer of a-Si having a doping concentration 10cm$^{-3}$ or higher on the active layer;
 d) annealing at elevated temperature to crystallize the active layer at a thermal budget lower than that is needed to crystallize the active layer without the presence of the heavily doped layer thereon;
 e) etching the heavily doped layer from above the active layer;
 f) patterning the active layer to form islands to isolate devices;
 g) forming n or p type source and drain regions in or on the active layer; and
 h) depositing and patterning source and drain electrodes.

30. The method of claim 29, wherein said heavily doped layer has a doping concentration of at least $10^{20}$ cm$^{-3}$.

31. The method of claim 29, wherein said active layer has a doping concentration no higher than $5 \times 10^{17}$ cm$^{-3}$.

32. The method of claim 29, wherein step (c) of forming the heavily doped layer is performed by deposition, and dopant species are mixed with silicon during the deposition.

33. The method of claim 29, wherein step (c) of forming the heavily doped layer is performed by implantation of at least one dopant species into said active layer deposited in step (b).

34. The method of claim 29, wherein the heavily doped layer is doped with a dopant selected from a group comprising boron and phosphorus.

35. The method of claim 29, wherein the annealing step (d) is carried by an annealing apparatus selected from the group comprising a furnace, a lamp or a light source, and a combination of a furnace and a lamp or light source.

36. The method of claim 29, wherein the annealing step (d) is carried out at a temperature range from 500° C. to 750° C.

37. The method of claim 29, wherein the annealing step (d) is done at 600° C. for no more than 6 hours.

38. The method of claim 29, wherein the annealing step (d) is done at 650° C. for no more than 40 minutes.

39. The method of claim 29, wherein the annealing step (d) is carried out in the presence of an oxidizing ambient.

40. The method of claim 39, wherein said oxidizing ambient is selected from the group comprising oxygen and $H_2O$.

41. The method of claim 29, wherein the annealing step (d) is at a pressure higher than 1 atmosphere.

42. The method of claim 29, wherein said active a-Si layer has a thickness in the range of 400 to 2000 angstroms.

43. A method of fabricating a coplanar top gate TFT structure having a channel, a source, a gate and a drain, comprising the steps of:
   a) depositing a barrier layer on a substrate;
   b) forming an active layer of a-Si on the barrier layer;
   c) forming a heavily doped layer of a-Si having a doping concentration of at least $10^{19}$ cm$^{-3}$ on the active layer;
   d) annealing at elevated temperature to crystallize the active layer at a thermal budget lower than that is needed to crystallize the active layer without the presence of the heavily doped layer thereon;
   e) etching the heavily doped layer;
   f) patterning the active layer in islands to isolate devices;
   g) forming a gate insulator layer;
   h) depositing a gate electrode layer and patterning the gate electrode; and
   i) doping source and drain regions and forming source drain electrodes.

44. The method of claim 43, wherein said heavily doped layer has a doping concentration $10^{20}$ cm$^{-3}$ or higher.

45. The method of claim 43, wherein said active layer has a doping concentration no higher than $5 \times 10^{17}$ cm$^{-3}$.

46. The method of claim 43, wherein, in the etching step (e), the heavily doped layer is etched only from above channel areas leaving the heavily doped layer in source and drain areas.

47. The method of claim 43, wherein step (c) of forming the heavily doped layer is performed by deposition, and dopant species are mixed with silicon during the deposition.

48. The method of claim 43, wherein step (c) of forming the heavily doped layer is performed by implantation of at least one dopant species into said active layer deposited in step (b).

49. The method of claim 43, wherein the heavily doped layer is doped with a dopant selected from a group comprising boron and phosphorus.

50. The method of claim 43, wherein the annealing step (d) is carried out by an annealing apparatus selected from the group comprising a furnace, a lamp or a light source, and a combination of a furnace and a lamp or light source.

51. The method of claim 43, wherein the annealing step (d) is carried out at a temperature range from 500° C. to 750° C.

52. The method of claim 43 wherein the annealing step (d) is done at 600° C. for no more than 6 hours.

53. The method of claim 43, wherein the annealing step (d) is done at 650° C. for no more than 40 minutes.

54. The method of claim 43, wherein the annealing step (d) is at a pressure higher than 1 atmosphere.

55. The method of claim 43, wherein said active layer has a thickness in the range of 400 to 2000 angstroms.

56. The method of claim 43, wherein the annealing step (d) is carried out in the presence of an oxidizing ambient.

57. The method of claim 56, wherein said oxidizing ambient is selected from the group comprising oxygen and $H_2O$.

58. A method of crystallizing an undoped or a lightly doped amorphous silicon (a-Si) comprising the steps of;
   a) forming a heavily doped layer of a-Si on a substrate as either as a continuous layer or as a plurality of discontinuous areas, the heavily doped layer having a doping concentration higher than $10^{19}$ cm$^{-3}$;
   b) forming the undoped or lightly doped layer of a-Si on the heavily doped layer;
   c) annealing the structure at elevated temperature to crystallize said undoped or lightly doped layer by crystal growth starting from the heavily doped layer;
   wherein the annealing step (c) is performed in the presence of an oxidizing ambient.

59. The method of claim 58, wherein said heavily doped layer has a doping concentration of at least $10^{20}$ cm$^{-3}$.

60. The method of claim 58, wherein said undoped or lightly doped layer has a thickness in the range of 400 to 2000 angstroms.

61. The method of claim 58 wherein the heavily doped layer is continuous.

62. The method of claim 58 wherein the heavily doped layer is a plurality of discontinuous areas.

63. The method of claim 62 wherein the undoped or lightly doped layer is crystallized by lateral crystal growth staffing from the discontinuous areas of the heavily doped layer.

64. A method of crystallizing an amorphous silicon (a-Si) comprising the steps of;
   a) depositing an undoped or lightly-doped a-Si layer on a substrate;
   b) forming a heavily doped a-Si layer having a doping concentration of at least $10^{19}$ cm$^{-3}$ on or in said undoped or lightly doped a-Si layer; and
   c) annealing at elevated temperature to crystallize said undoped or lightly-doped a-Si layer at a thermal budget below that which would crystallize said undoped or lightly doped silicon layer without the heavily doped a-Si thereon, such that the crystallization staffs from the heavily doped a-Si layer and continues to crystallize the undoped or lightly doped a-Si layer;
   wherein the annealing step (c) is at a pressure higher than 1 atmosphere.

65. A method of crystallizing an undoped or a lightly doped amorphous silicon (a-Si) comprising the steps of;
   a) forming a heavily doped layer of a-Si on a substrate as either as a continuous layer or as a plurality of discontinuous areas, the heavily doped layer having a doping concentration higher than $10^{19}$ cm$^{-3}$;
   b) forming the undoped or lightly doped layer of a-Si on the heavily doped layer;
   c) annealing the structure at elevated temperature to crystallize said undoped or lightly doped layer by crystal growth starting from the heavily doped layer;
   wherein the annealing step (c) is at a pressure higher than 1 atmosphere.

66. A method of fabricating a coplanar top gate TFT structure having a channel, a source, a gate and a drain, comprising the steps of:
   a) forming an active layer of a-Si on a substrate;
   b) forming a heavily doped layer of a-Si having a doping concentration of at least $10^{19}$ cm$^{-3}$ on the active layer;
   c) annealing at elevated temperature to crystallize the active layer at a thermal budget lower than that is needed to crystallize the active layer without the presence of the heavily doped layer thereon;
   d) etching the heavily doped layer;
   e) patterning the active layer in islands to isolate devices;
   f) forming a gate insulator layer;
   g) depositing a gate electrode layer and patterning the gate electrode; and
   h) forming doped source and drain regions and forming source drain electrodes.

* * * * *